United States Patent [19]
Schillhof

[11] 3,979,609
[45] Sept. 7, 1976

[54] STATION FINDER CIRCUIT FOR TWO DIRECTIONS

[75] Inventor: Udo Schillhof, Hamburg, Germany

[73] Assignee: U.S. Philips Corporation, New York, N.Y.

[22] Filed: Dec. 11, 1974

[21] Appl. No.: 531,713

[30] Foreign Application Priority Data
Dec. 20, 1973 Germany............................ 2363349

[52] U.S. Cl............................. 307/247 R; 307/216; 307/218; 307/246; 334/18
[51] Int. Cl.²................. H03K 17/16; H03K 19/32
[58] Field of Search .............. 328/127, 181; 334/18; 307/246, 247 R, 216, 218

[56] References Cited
UNITED STATES PATENTS

| | | | |
|---|---|---|---|
| 3,591,858 | 7/1971 | Boyd et al...................... | 328/127 X |
| 3,654,560 | 4/1972 | Cath et al........................... | 328/127 |
| 3,736,528 | 5/1973 | Acker et al..................... | 328/127 X |
| 3,743,951 | 7/1973 | Carroll............................... | 328/181 |

Primary Examiner—John S. Heyman
Attorney, Agent, or Firm—Frank R. Trifari

[57] ABSTRACT

A search tuning circuit for two search directions which includes a starting signal memory having a starting signal input. A search direction signal memory having first and second operating signal inputs is coupled to the starting signal input of the starting signal memory and to first and second search direction signal inputs of the search direction signal memory. The circuit is responsive to an operating signal at an operating signal input to write a search direction signal for a certain search direction at a starting in the corresponding memories. This circuit further include a gating circuit which in the event of simultaneous operating signals at the first and second operating signal inputs a starting signal will occur only at the starting signal input of the starting signal memory without a search direction signal being generated.

5 Claims, 2 Drawing Figures

STATION FINDER CIRCUIT FOR TWO DIRECTIONS

The invention relates to a search tuning circuit for two search directions comprising a starting signal memory, a search direction signal memory and two operating signal inputs which are coupled to a starting signal input of the starting signal memory and to two search direction signal inputs of the search direction signal memory so that in the presence of an operating signal at an operating signal input a search direction signal for a certain search direction and a starting signal can be written in the corresponding memories.

A search tuning circuit of the kind described above is known from German Offenlegungsschrift No. 2,055,238 in which the operating signal inputs are constituted by the ends of two switches which can be operated manually. When operating each switch a starting signal is generated which is applied to the starting signal input of the starting signal memory.

It is an object of the invention to render automatic starting of such a search tuning circuit possible.

A search tuning circuit of the kind described in the preamble is characterized in that a gating circuit is incorporated between the operating signal inputs and the starting signal and search direction signal inputs of the starting signal memory and the search direction signal memory and this in such a manner that in case of simultaneous presence of an operating signal at the two operating signal inputs only a starting signal occurs at the starting signal input of the starting signal memory without a search direction signal being generated.

Due to the step according to the invention it is possible to start the circuit arrangement automatically or by hand without the search direction being influenced.

The invention will now be described with reference to the drawing.

Figure 1:
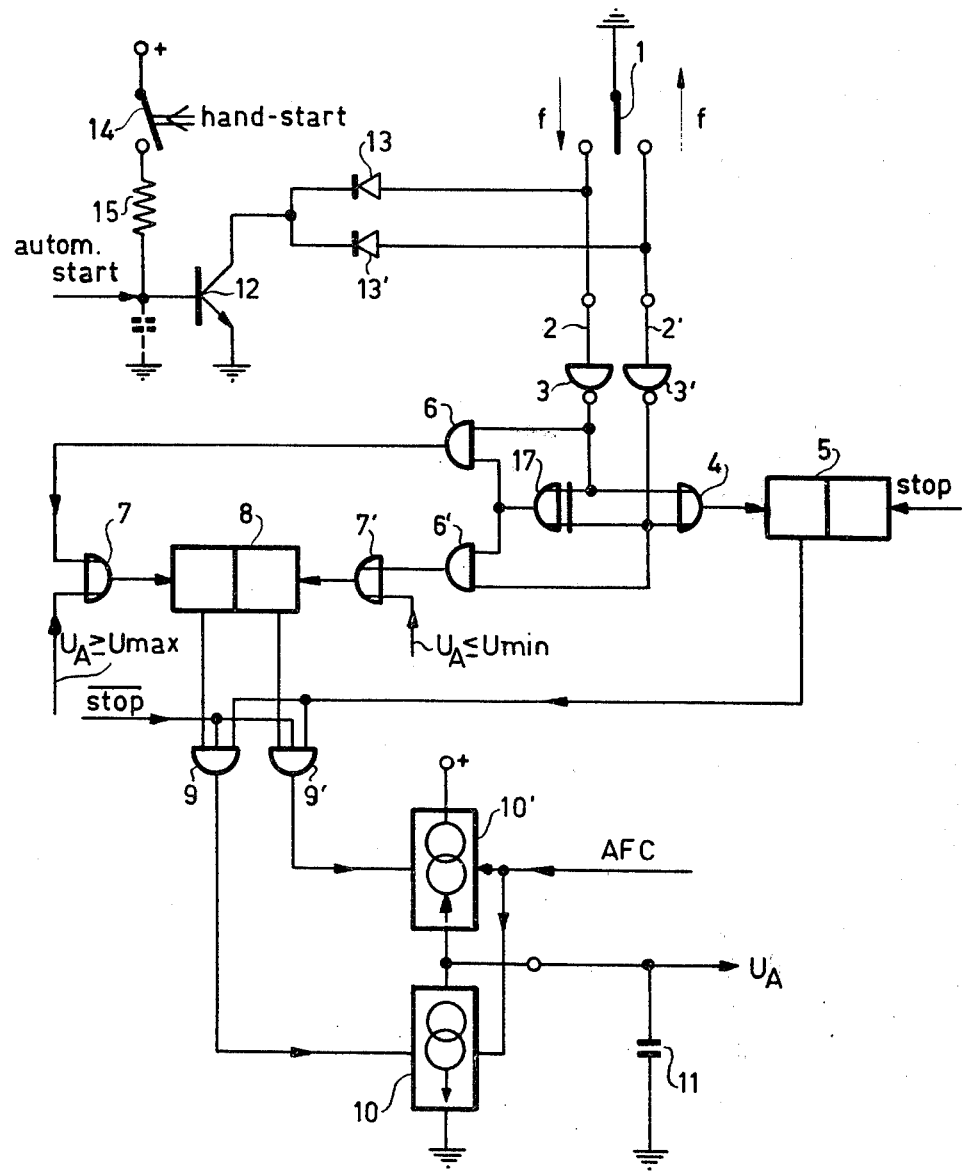
FIG. 1 shows by way of a block-schematc diagram a search tuning circuit according to the invention.

FIG. 1 shows a change-over switch 1 formed as a search direction switch one terminal of which is connected to ground and which can optionally be connected to one of the two operating signal inputs 2 and 2'. The operating signal inputs 2 and 2' are connected to inverters 3 and 3', respectively, inverting the binary operating signal. When there is no operating signal, the outputs of the inverters 3 and 3' convey a logical 0. When the search direction switch 1 is connected to one of the operating signal inputs 2 and 2', the inverter connected to this input conveys a logical 1. The two outputs of the inverters 3 and 3' are connected to an OR gate 4 controlling a starting signal memory 5 which may be formed, for example, as a flip-flop. Furthermore the inverter outputs are each connected to outputs of AND gates 6 and 6' and to the two inputs of an exclusive OR gate 17 whose output is connected to the two other inputs of the AND gates 6 and 6'. The outputs of the AND gates 6 and 6' are connected to one input of OR gates 7 and 7', respectively, while the other input of these OR gates always conveys the logical 1 when the tuning voltage $U_A$ satisfies the condition $U_A \geq U_{max}$ and $U_A \leq U_{min}$, respectively. The outputs of the OR gates 7 and 7' are connected to a search direction signal input of a search direction memory 8 which may be likewise formed as a flip-flop. Two outputs of the search direction memory 8 are each connected to inputs of AND gates 9 and 9' respectively. Other inputs of each of the AND gates 9 and 9' are also connected to an output of the starting signal memory 5. The logical 1 is always present at the other inputs of the AND gates 9 and 9' when the search action is not to be interrupted or discontinued. Outputs of the AND gates 9 and 9' are connected to current sources 10 and 10', respectively, the current source 10 serving for discharging a capacitor 11 and the current source 10' serving for charging this capacitor from which the tuning voltage $U_A$ can be derived. The current sources 10 and 10' are also controllable by a control voltage AFC for maintaining a frequency once adjusted constant.

Not only can the operating signal input 2, 2' be connected to ground by operating the direction switch 1, but also by interconnecting a transistor 12 whose collector is connected to the control inputs through diodes 13 and 13'. The transistor 12 may be interconnected either automatically by applying a voltage generated by an automatic starter (not shown) to its base, or manually by connecting its base to a positive potential through a switch 14 which can be manually operated and a resistor 15. Then there is no change of the search direction. The elements 2 to 10 may be combined in an integrated circuit.

The circuit arrangement operates as follows: when the search direction switch 1 is operated, which is connected for example to the control input 2, the binary signal 1 appears at the output of the inverter 3 while the signal 0 is present at the output of the inverter 3'. The output signal from the inverter 3 activates the starting signal memory 5 through the OR gate 4. In this condition the output of the exclusive OR gate 7 conveys the signal 1 so that the signal 1 is present at the output of the AND gate 6. On the other hand the signal 0 is present at the output of 6'. The output of the AND gate 6 activates the set input of the search direction memory 8 through the OR gate 7 so that the signal 1 appears at the output thereof which is connected to the AND gate 9. Since also the output of the starting signal memory 5 conveys the signal 1, the current source 10 discharging the capacitor 11 is switched on when a signal is also present at the third input of the AND gate 9 which does not interrupt the search action. When tuning is effected to a station, the signal 0 appears at the central input of the AND gate 9 so that the current source 10 is switched off so as to check whether the received station satisfies certain criteria (for example, input field strength above a certain threshold value, pilot signal present). When this is not the case the signal 1 appears again at the central input and the search action continues. When a station is received which satisfies the said criteria, a stop signal appears at a reset input of the starting signal memory 5 so that the signal 0 appears at the output of the starting signal memory connected to the AND gates 9 and 9' and the current source 10 is definitively switched off.

When the search direction switch 1 is connected to the control input 2', corresponding operations are performed in the elements 2' . . . 10' in which of course the capacitor 11 is charged.

When the tuning voltage during the search action reaches its upper or lower maximum value, a logical 1 appears at an input of one of the OR gates 7 and 7' so that the search direction memory 8 is changed over causing the switched-on current source to be switched off and the switched-off current source to be switched on. When after resetting the starting signal memory i.e.

when definitive tuning has been effected to a station, the command for a further search action is given by an automatic starting signal or through the transistor 12 by manual operation of the switch 14. This transistor 12 is then rendered conducting and the two control inputs 2 and 2' are connected to ground through the diodes 13 and 13'. As a result a logical 1 appears at the outputs of the two inverters 3 and 3' so that the starting signal memory is written in through the OR gate 4. Furthermore a 0 appears at the output of the exclusive OR gate 17 so that a 0 also appears at the outputs of the AND gates 6 and 6'. The contents of the search direction memory 8 are thus not changed. An advantage of this circuit arrangement is that when the elements 2 and 2' to 10 and 10' are combined in an integrated circuit this integrated circuit needs no extra input for the command for a further search action.

In practice the response characteristics of the diodes 13 and 13' are never exactly equal. In addition the output voltage of the transistor 12 cannot vary exactly rectangularly. Moreover the voltage at one of the control inputs 2 and 2' may sooner reach the value generating the logical 1 at the outputs of the inverters 3 and 3' so that an 1 and a 0 are available for the inputs of the exclusive OR gate 17 for which reason the output thereof conveys the signal 1 and one of the two set inputs of the search direction memory 8 is set.

Figure 2:
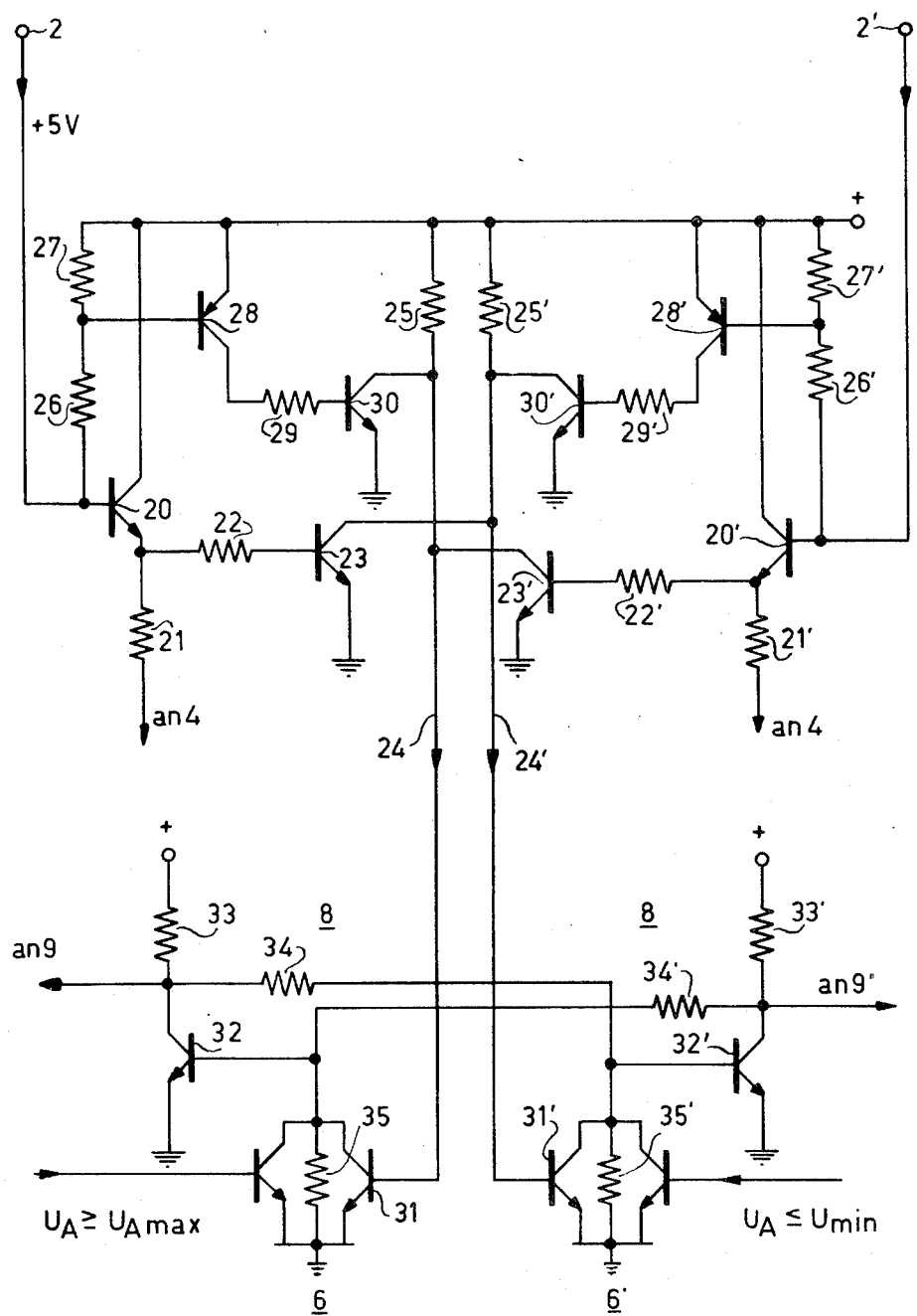
FIG. 2 shows part of this circuit in detail.

FIG. 2 shows a circuit arrangement in which this is prevented. Here corresponding elements have the same reference numerals as in FIG. 1.

FIG. 2 shows that part of the circuit arrangement according to FIG. 1 in detail which relates to changing over the search direction memory. The control input 2 (2') is connected to the base of a transistor 20 (20') whose emitter is connected through resistors 21, 22 (21', 22') to the OR gate 4 and to the base of a transistor 23 (23') whose emitter is connected to ground and whose collector is connected to a lead 24' (24) which is connected through a resistor 25 (25') to a positive potential of, for example, +5 V. The collector of the transistor 20 (20') is likewise connected to a positive potential.

The operating signal input 2 (2') is also connected to the positive potential through a potential divider which comprises a resistor 26 (26') of 3.3 kOhm and a resistor 27 (27') of 2.2 kOhm. The base of a pnp silicon transistor 28 (28') is connected to the tap on this potential divider (all other transistors are silicon transistors of the npn type) whose emitter is connected to the positive potential and whose collector is connected through a resistor 29 (29') of 10 kOhm to the base of a transistor 30 (30') whose emitter is connected to ground and whose collector is connected to the lead 24 (24').

The lead 24 (24') is connected to the base of a transistor 31 (31') constituting part of the AND gates 6 and 6'. The collector of this transistor is connected to the base of a transistor 32 (32') whose collector is connected through a resistor 33 (33') to the positive potential. The collector voltage is applied through a potential divider comprising the resistors 34 and 35' (34' and 35) to the base of a further transistor 32' (32). In this manner a flipflop circuit is produced which serves as a direction store.

The circuit arrangement shown in FIG. 2 operates as follows:

In the rest condition (the search direction switch is not operated, there is no command for a further search action) a voltage of 5 V is present at the base of the transistor 20 (20'). The transistors 20 and 23 (20' and 23') are then conducting while the transistors 28 and 30 (28' and 30') are cut off. A current then flows through the collector-emitter path of the transistor 23 (23') and through the resistor 25 (25') so that the potential at the lead 24 (24') is very low (less than 0.5 V). At this voltage the transistors 31 (31') are cut off and the search direction memory remains in the state in which it was.

When the switch 1 in FIG. 1 is operated, a voltage of 0 V appears at one of the inputs, for example, input 2. Under these circumstances the transistor 20 is cut off and thus also the transistor 23. On the other hand the transistor 28 and thus also transistor 30 conduct. In this condition the transistors 23' and 30 conduct while the transistors 23 and 30' are cut off. Consequently no current flows through the resistor 25' so that the transistor 31' conducts and the base of the transistor 32' is short-circuited. Then the transistor 32 is cut off and a positive voltage (logical 1) appears at the collector output which voltage is applied to the AND gate 9' (FIG. 1). In the same way a positive voltage appears at the output of the transistor 32 when a 0 potential appears at the input 2'.

When the 0-potential is simultaneously present at the operating signal inputs 2 and 2' which is the case when a signal for a further search action is generated, which signal renders the transistor 12 (FIG. 1) conducting, the transistors 30 and 30' have become conducting in the final state while the transistors 23 and 30' which were conducting when an input signal was absent will then be cut off as will be further described hereinafter.

When a positive voltage is applied to the base of the transistor 12 (FIG. 1) this transistor becomes conducting, while means are provided which prevent the collector voltage from dropping stepwise from a positive voltage to substantially 0V (in the drawing this is shown by the capacitor at the base of the transistor 12 in broken lines). The voltage at the base electrodes of the transistor 20 then decreases comparatively slowly. As soon as this voltage has reached a value of approximately 3.5 V, the transistors 28 and 30 (28' and 30') become conducting so that with this input voltage the four transistors 23, 23', 30 and 30' operating as switches are conducting. When the voltage at the base electrodes of the transistors 20 and 20' decreases to below a value of approximately 1.4 V, the transistors 20, 23 (20', 23') are cut off. The state of the search direction memory does not change because at least one of the transistor switches 23' and 30 (23 and 30') connected to the lead 24 (24') is conducting so that the transistors 31 and 31' of the AND gates 6 and 6' always remain blocked. Even if in this circuit arrangement the voltages at the base electrodes considerably deviated (for example 0.5 V) due to tolerances of the elements present between the collector of the transistor 12 and the base electrodes of the transistors 20 and 20', then the state of the memory would not be changed because the different voltage values at which the transistor switches 23 and 30 react and the non-rectangularly increasing voltage at the base electrodes of the transistors 20 and 20' would always cause the transistor switches 30 and 30' to be conducting (so that the search direction signal inputs of the search direction memory 8 are cut off before the transistors 23 and 23' are cut off (so that the search direction signal inputs would be enabled if they were not blocked by the switches 30 and 30'). Even if the voltage at the base electrodes of the transistors 20 and 20' decays stepwise, the circuit proportioning ensures that the switches 23 and 23' are not cut off before the transistors 30 and 30' conduct.

What is claimed is:

1. A search tuning circuit for two search directions comprising a starting signal memory having a starting signal input, a search direction signal memory having first and second operating signal inputs, first and second starting signal inputs, each starting signal input being coupled to said starting signal input of said starting signal memory and to said first and second search direction signal inputs of said search direction signal memory, said circuit being responsive to an operating signal at an operating signal input to write a search direction signal for a certain search direction and a starting signal in the corresponding memories, said circuit further including a gating circuit intermediate said (1) first and second operating signal inputs and (2) said starting signal and (3) search direction signal inputs of said starting signal memory and said (4) search direction signal memory, said gating circuit including means which in case of simultaneous presence of operating signals at said first and second operating signal inputs only a starting signal occurs at the starting signal input of said starting signal memory without a search direction signal being generated.

2. A search tuning circuit as claimed in claim 1 wherein each of said first and second operating signal inputs is connected to an input of an AND gate, each output signal controlling one of the search direction signal inputs of the search direction memory the operating signal inputs being connected to the two inputs of an exclusive OR gate whose output is connected to an input of an AND gate.

3. A search tuning circuit as claimed in claim 1 wherein said circuit includes first and second switches which are responsive to one of said operating signal inputs, one of said switches in the rest condition blocking one search direction signal input of the search direction memory associated with the operating signal input and said second switch enables the other search direction signal input, one of said switches being enabled when a signal is applied and the other being blocked.

4. A search tuning circuit as claimed in claim 3 wherein said circuit includes means to connect said switches in the transition between the rest condition (logical 1) and the presence of a signal at the operating signal input (logical 0) one switch always blocks and the other switch blocks before one switch conducts.

5. A search tuning circuit as claimed in claim 4 further including a delay circuit which includes means by which the transition between the rest condition (logical 1) and the operating condition (logical 0) does not take place stepwise when simultaneously a signal is applied to the two operating signal inputs.

* * * * *